(12) United States Patent
Zhu et al.

(10) Patent No.: US 9,721,634 B2
(45) Date of Patent: Aug. 1, 2017

(54) DECOUPLING OF SOURCE LINE LAYOUT FROM ACCESS TRANSISTOR CONTACT PLACEMENT IN A MAGNETIC TUNNEL JUNCTION (MTJ) MEMORY BIT CELL TO FACILITATE REDUCED CONTACT RESISTANCE

(71) Applicant: QUALCOMM Incorporated, San Diego, CA (US)

(72) Inventors: Xiaochun Zhu, San Diego, CA (US); Yu Lu, San Diego, CA (US); Chando Park, Irvine, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/860,931

(22) Filed: Sep. 22, 2015

(65) Prior Publication Data
US 2016/0315248 A1  Oct. 27, 2016

Related U.S. Application Data

(60) Provisional application No. 62/153,467, filed on Apr. 27, 2015.

(51) Int. Cl.
*G11C 11/16* (2006.01)
*H01L 27/22* (2006.01)

(52) U.S. Cl.
CPC ........ *G11C 11/1659* (2013.01); *G11C 11/161* (2013.01); *H01L 27/228* (2013.01)

(58) Field of Classification Search
CPC ......... H01L 43/02; H01L 43/08; H01L 43/12; H01L 27/228; G11C 11/659; G11C 11/161
See application file for complete search history.

(56) References Cited

U.S. PATENT DOCUMENTS

| | | | | |
|---|---|---|---|---|
| 4,288,802 A | * | 9/1981 | Ronen ................... | H01L 27/112 257/401 |
| 6,724,653 B1 | * | 4/2004 | Iwata ....................... | G11C 8/10 365/145 |

(Continued)

OTHER PUBLICATIONS

International Search Report and Written Opinion for PCT/US2016/024448, mailed Jun. 15, 2016, 11 pages.

(Continued)

*Primary Examiner* — John C Ingham
*Assistant Examiner* — Gustavo Ramallo
(74) *Attorney, Agent, or Firm* — Withrow & Terranova, PLLC

(57) ABSTRACT

Magnetic tunnel junction (MTJ) memory bit cells that decouple source line layout from access transistor node size to facilitate reduced contact resistance are disclosed. In one example, an MTJ memory bit cell is provided that includes a source plate disposed above and in contact with a source contact for a source node of an access transistor. A source line is disposed above and in electrical contact with the source plate to electrically connect the source line to the source node. The source plate allows the source line to be provided in a higher metal level from the source and drain contacts of the access transistor such that the source line is not in physical contact with (i.e., decoupled from) the source contact. This allows pitch between the source line and drain column to be relaxed from the width of the source and drain nodes without having to increase contact resistance.

36 Claims, 11 Drawing Sheets

(56) References Cited

U.S. PATENT DOCUMENTS

| | | | |
|---|---|---|---|
| 7,755,153 B2 | 7/2010 | Ho et al. | |
| 8,159,870 B2 | 4/2012 | Xia | |
| 8,208,290 B2 | 6/2012 | Rao et al. | |
| 2002/0020917 A1* | 2/2002 | Hirota | H01L 23/5222 257/758 |
| 2004/0264242 A1* | 12/2004 | Nejad | B82Y 10/00 365/158 |
| 2006/0027846 A1 | 2/2006 | Lee et al. | |
| 2008/0073670 A1* | 3/2008 | Yang | H01L 29/404 257/194 |
| 2008/0073787 A1* | 3/2008 | Oh | H01L 21/2885 257/751 |
| 2008/0186773 A1* | 8/2008 | Bergemont | G11C 16/0416 365/185.18 |
| 2008/0247222 A1* | 10/2008 | Jung | G11C 11/16 365/158 |
| 2009/0073749 A1 | 3/2009 | Dittrich et al. | |
| 2009/0296477 A1* | 12/2009 | Kim | H01L 27/11521 365/185.17 |
| 2010/0220517 A1 | 9/2010 | Okayama | |
| 2011/0044093 A1 | 2/2011 | Koh et al. | |
| 2013/0170281 A1 | 7/2013 | Song et al. | |

OTHER PUBLICATIONS

Second Written Opinion for PCT/US2016/024448, mailed Mar. 22, 2017, 5 pages.

\* cited by examiner

DECOUPLING OF SOURCE LINE LAYOUT FROM ACCESS TRANSISTOR CONTACT PLACEMENT IN A MAGNETIC TUNNEL JUNCTION (MTJ) MEMORY BIT CELL TO FACILITATE REDUCED CONTACT RESISTANCE

PRIORITY APPLICATION

This application claims priority under 35 U.S.C. §119(e) to U.S. Provisional Patent Application Ser. No. 62/153,467 filed on Apr. 27, 2015 and entitled "MAGNETIC TUNNEL JUNCTION (MTJ) MEMORY BIT CELLS EMPLOYING AN ELONGATED ACTIVE LAYER CONTACT PAD(S) FOR REDUCED CONTACT RESISTANCE," which is incorporated herein by reference in its entirety.

BACKGROUND

I. Field of the Disclosure

The technology of the disclosure relates generally to magnetic tunnel junctions (MTJs), and more particularly to MTJs employed in magnetic random access memory (MRAM) bit cells to provide MRAM.

II. Background

Semiconductor storage devices are used in integrated circuits (ICs) in electronic devices to provide data storage. One example of a semiconductor storage device is magnetic random access memory (MRAM). MRAM is non-volatile memory in which data is stored by programming a magnetic tunnel junction (MTJ) as part of an MRAM bit cell. One advantage of an MRAM is that MTJs in MRAM bit cells can retain stored information even when power is turned off. This is because data is stored in the MTJs as a small magnetic element rather than as an electric charge or current.

In this regard, an MTJ comprises a free ferromagnetic layer ("free layer") disposed above a fixed or pinned ferromagnetic layer ("pinned layer"). The free and pinned layers are formed from a ferromagnetic material either with perpendicular magnetic anisotropy (i.e., the magnetization direction is perpendicular to a layer plane) to form a perpendicular MTJ (pMTJ), or with in-plane magnetic anisotropy to form an in-plane MTJ. The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists. The magnetic orientations of the free and pinned layers can be sensed to read data stored in the MTJ by sensing a resistance when current flows through the MTJ. Data can also be written and stored in the MTJ by applying a magnetic field to change the magnetic orientation of the free layer to either a P or AP magnetic orientation with respect to the pinned layer.

Recent developments in MTJ devices involve spin transfer torque (STT)-MRAM devices. In STT-MRAM devices, the spin polarization of electrons, rather than the local magnetic fields, is used to program the state stored in the MTJ (i.e., a '0' or a '1'). In this regard, FIG. 1 illustrates a STT-MTJ 100. The STT-MTJ 100 is provided as part of an MTJ memory bit cell 102 to store non-volatile data. A metal-oxide semiconductor (MOS) (typically n-type MOS, i.e., NMOS) access transistor 104 is provided to control reading and writing to the STT-MTJ 100. A drain node (D) of the access transistor 104 is coupled to a bottom electrode 106 of the STT-MTJ 100, which is coupled to a pinned layer 108. A word line (WL) is coupled to a gate node (G) of the access transistor 104. A source node (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the STT-MTJ 100, which is coupled to a free layer 112. The pinned layer 108 and the free layer 112 are separated by a tunnel barrier 114.

With continuing reference to FIG. 1, when writing data to the STT-MTJ 100, the gate node (G) of the access transistor 104 is activated by activating the word line (WL). A voltage differential between a voltage ($V_{BL}$) on the bit line (BL) and the voltage ($V_{SL}$) on the source line (SL) is applied. As a result, a write current (I) is generated between the drain node (D) and the source node (S) of the access transistor 104. If the magnetic orientation of the STT-MTJ 100 in FIG. 1 is to be changed from AP to P, a write current ($I_{AP-P}$) flowing from the top electrode 110 to the bottom electrode 106 is generated. This induces a spin transfer torque (STT) at the free layer 112 to change the magnetic orientation of the free layer 112 to P with respect to the pinned layer 108. If the magnetic orientation is to be changed from P to AP, a current ($I_{P-AP}$) flowing from the bottom electrode 106 to the top electrode 110 is produced, which induces an STT at the free layer 112 to change the magnetic orientation of the free layer 112 to AP with respect to the pinned layer 108.

With continuing reference to FIG. 1, the write current (I) required to be generated between the bit line (BL) and the source line (SL) of the MTJ memory bit cell 102 may be fifty (50) to one hundred (100) micro-Amps ($\mu A$) as an example. As fabrication processes allow nodes to be further scaled down in size to reduce area for a given chip or package size, metal interconnection resistance increases due to the reduced cross-sectional area available for metal interconnects in the chip. Thus for example, if the size of the MTJ memory bit cell 102 in FIG. 1 is maintained in a given chip or package as node size is scaled down, the amount of write current (I) generated across the STT-MTJ 100 will drop due to the increased resistance in the bit line (BL) and the source line (SL) for a given voltage source ($V_S$) level (i.e., write current (I)=($V_{SL}$−$V_{BL}$)/resistance). Thus, the write current (I) margin is reduced, which can lead to reduced write performance of the MTJ memory bit cell 102 and yield loss. To solve the issue of increased resistance in the MTJ memory bit cell 102 from node size down scaling, the voltage ($V_{SL}$) supplied by the voltage source ($V_S$) can be increased to maintain the write current (I) to a required current level necessary to perform write operations in the MTJ memory bit cell 102. However, increasing the voltage ($V_{SL}$) of the voltage source ($V_S$) increases power consumption, which may be undesirable. Also, in many chip designs, it may not be possible to increase the voltage ($V_{SL}$) of the voltage source ($V_S$), because the voltage source ($V_S$) is reduced in accordance with general semiconductor technology scaling, for example, to maintain gate dielectric integrity and to reduce overall power consumption in the chip.

SUMMARY OF THE DISCLOSURE

Aspects of the disclosure involve decoupling of source line layout from access transistor contact placement in a magnetic tunnel junction (MTJ) memory bit cell to facilitate reduced contact resistance. Related methods and systems are also disclosed. As feature size for an MTJ memory bit cell is scaled down, the width of an access transistor in the MTJ memory bit cell is scaled down. Thus, the distance between source and drain contacts for the access transistor is also reduced, because it is generally desired to center the source and drain contacts to an active area of the access transistor, respectively, to minimize contact resistance and contact resistance variation. However, the pitch between metal lines contacting the source and drain contacts to provide the source line and a drain column, respectively, may not be able to be reduced due to fabrication process limitations. Thus, to avoid skewing the contact of the metal lines forming the source line and included in the drain column with the source and drain contacts of the access transistor in the MTJ memory bit cell layout, aspects disclosed herein include MTJ memory bit cells that include a source plate disposed above the source contact and in contact with the source contact. A source line is disposed above the source plate and is in electrical contact with the source plate to electrically connect the source line to the source node. The source plate allows the source line to be provided in a higher metal layer from the source and drain contacts of the access transistor in the MTJ memory bit cell such that the source line is not in physical contact or decoupled from the layout of the source contact. This allows the pitch between the source line and the drain column to not have to be reduced in kind with a reduction of the access transistor that would otherwise result in a skewed contact and increase in contact resistance. Also, as one non-limiting example, the source and drain contacts can be elongated in size to further reduce contact resistance to avoid a reduced write performance and increased yield loss as a result.

In this regard, in one exemplary aspect, an MTJ memory bit cell in an integrated circuit (IC) is provided. The MTJ memory bit cell comprises an active semiconductor layer comprising an access transistor comprising a source node, a drain node, and a gate node. The MTJ memory bit cell also comprises a drain contact disposed above the drain node and in contact with the drain node. The MTJ memory bit cell also comprises a source contact disposed above the source node and in contact with the source node. The MTJ memory bit cell also comprises a drain column comprising a drain plate disposed above the drain contact and in contact with the drain contact. The MTJ memory bit cell also comprises an MTJ disposed above the active semiconductor layer in electrical contact with the drain column. The MTJ memory bit cell also comprises a source plate disposed above the source contact and in contact with the source contact. The MTJ memory bit cell also comprises a source line disposed above the source plate and in electrical contact with the source plate to electrically connect the source line to the source node.

In another exemplary aspect, an MTJ memory bit cell in an IC is provided. The MTJ memory bit cell comprises a means for providing an access transistor in an active semiconductor layer, the means for providing the access transistor comprising a source node, a drain node, and a gate node. The MTJ memory bit cell also comprises a means for contacting the drain node, disposed above the drain node. The MTJ memory bit cell also comprises a means for contacting the source node, disposed above the source node. The MTJ memory bit cell also comprises a means for contacting the means for contacting the drain node, disposed above the means for contacting the drain node. The MTJ memory bit cell also comprises an MTJ disposed above the active semiconductor layer in electrical contact with a drain column. The MTJ memory bit cell also comprises a means for contacting the means for contacting the source node, disposed above the means for contacting the source node. The MTJ memory bit cell also comprises a means for providing a source line disposed above the means for contacting the means for contacting the source node, the means for providing the source line in electrical contact with the means for contacting the means for contacting the source node, to electrically connect the means for providing the source line to the source node.

In another exemplary aspect, a method of fabricating an MTJ memory bit cell in an IC is provided. The method comprises providing a substrate. The method also comprises disposing an active semiconductor layer on the substrate, the active semiconductor layer comprising an access transistor comprising a source node, a drain node, and a gate node. The method also comprises disposing a drain contact above the drain node and in contact with the drain node. The method also comprises disposing a source contact above the source node and in contact with the source node. The method also comprises disposing a drain column comprising a drain plate above the drain contact and in contact with the drain contact. The method also comprises disposing a source plate disposed above the source contact and in contact with the source contact. The method also comprises disposing a source line above the source plate and in electrical contact with the source plate to electrically connect the source line to the source node. The method also comprises disposing an MTJ above the active semiconductor layer in electrical contact with the drain column

DETAILED DESCRIPTION

Figure 1:
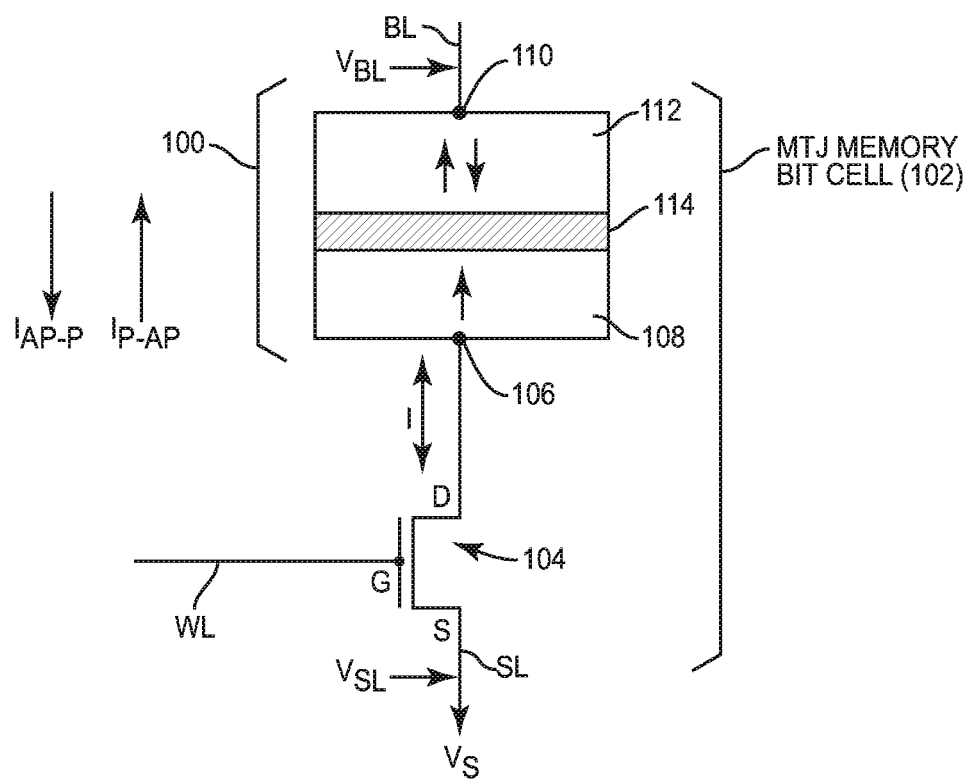
FIG. 1 is a schematic diagram of an exemplary magnetic random access memory (MRAM) bit cell that can be provided in an MRAM array in an integrated circuit (IC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the disclosure involve decoupling of source line layout from access transistor contact placement in a magnetic tunnel junction (MTJ) memory bit cell to facilitate reduced contact resistance. Related methods and systems are also disclosed. As feature size for an MTJ memory bit cell is scaled down, the width of an access transistor in the MTJ memory bit cell is scaled down. Thus, the distance between source and drain contacts for the access transistor is also reduced, because it is generally desired to center the source and drain contacts to an active area of the access transistor, respectively, to minimize contact resistance and contact resistance variation. However, the pitch between metal lines contacting the source and drain contacts to provide the source line and a drain column, respectively, may not be able to be reduced due to fabrication process limitations. Thus, to avoid skewing the contact of the metal lines forming the source line and included in the drain column with the source and drain contacts of the access transistor in the MTJ memory bit cell layout, aspects disclosed herein include MTJ memory bit cells that include a source plate disposed above the source contact and in contact with the source contact. A source line is disposed above the source plate and is in electrical contact with the source plate to electrically connect the source line to the source node. The source plate allows the source line to be provided in a higher metal layer from the source and drain contacts of the access transistor in the MTJ memory bit cell such that the source line is not in physical contact or decoupled from the layout of the source contact. This allows the pitch between the source line and the drain column to not have to be reduced in kind with a reduction of the access transistor that would otherwise result in a skewed contact and increase in contact resistance. Also, as one non-limiting example, the source and drain contacts can be elongated in size to further reduce contact resistance to avoid a reduced write performance and increased yield loss as a result.

Figure 2:
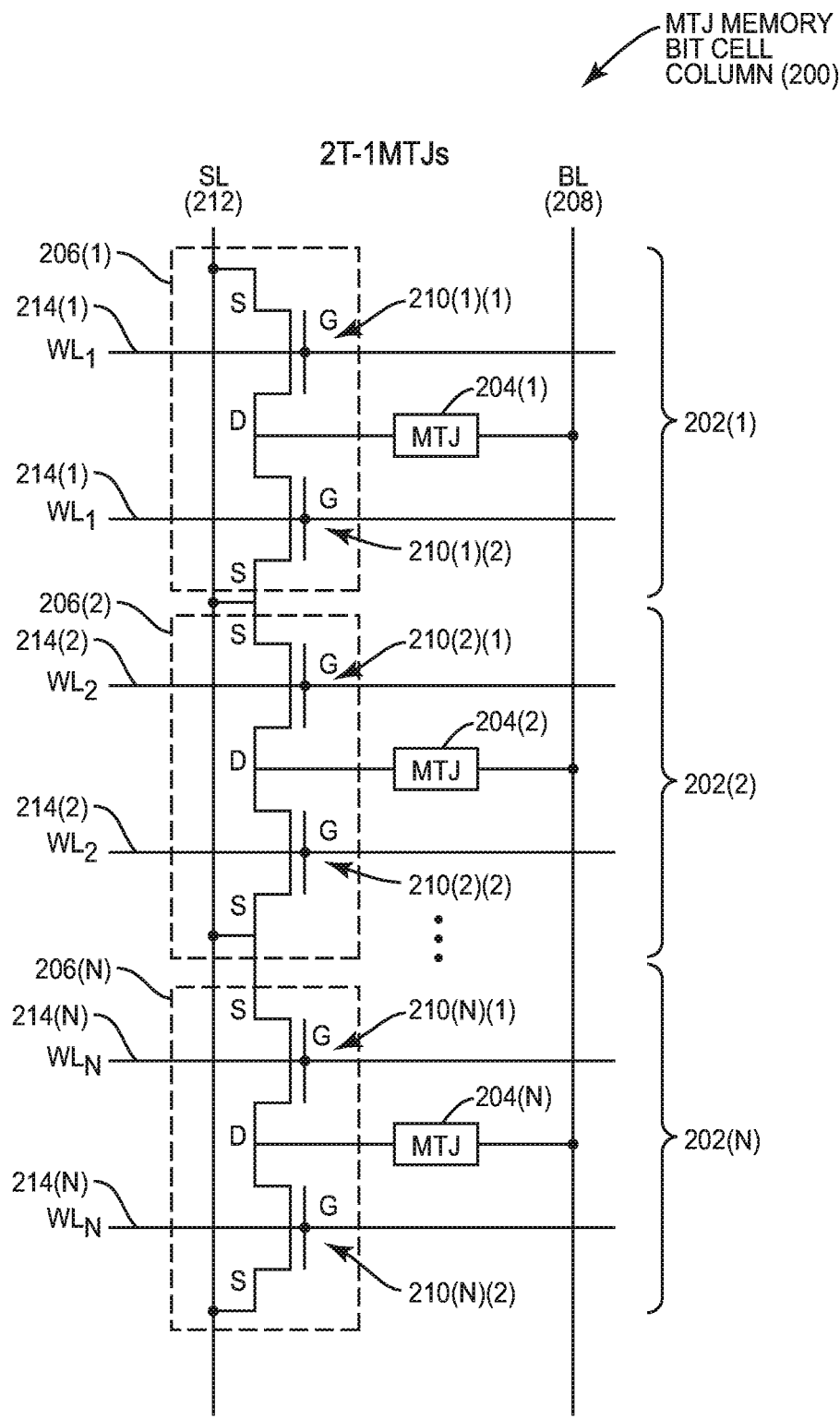
FIG. 2 is a circuit diagram of an exemplary memory bit cell column employing two transistor (2T), one (1) magnetic tunnel junction (MTJ) (2T-1MTJ) bit cells for memory storage.
Figures 3A, 3B:
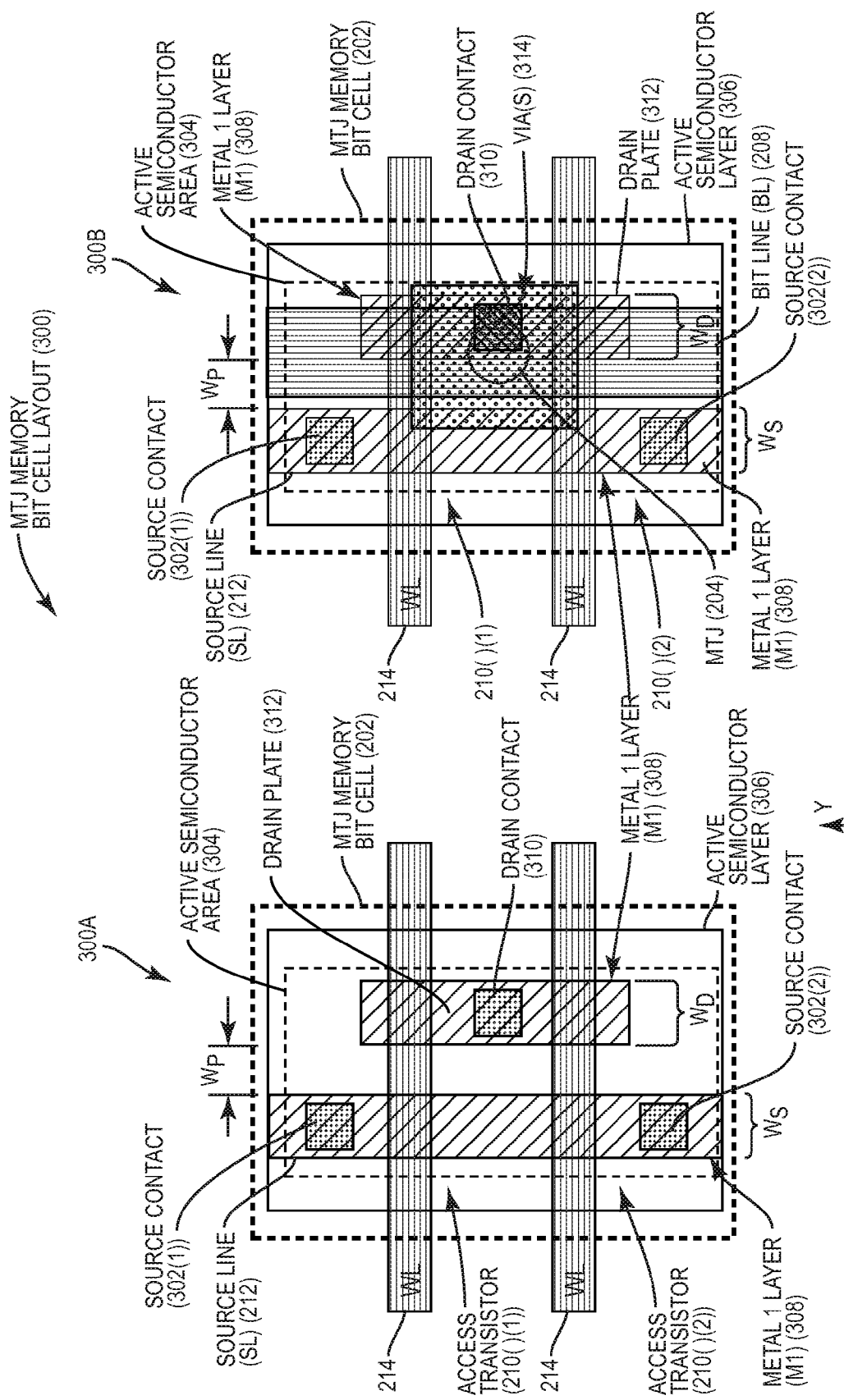
FIG. 3A is a top view of an exemplary partial MTJ memory bit cell layout for a 2T-1MTJ memory bit cell that includes a source line formed from a metal line disposed in a metal layer directly above source contacts of access transistors and contacting the source contacts to couple the source line to the source nodes of the access transistors.
FIG. 3B is a top view of a final memory bit cell layout for the 2T-1MTJ memory bit cell in FIG. 3A that additionally includes an MTJ in electrical contact to a drain column to be electrically connected to a drain node of the access transistors, and a bit line disposed in electrical contact to the MTJ.
Figure 4:
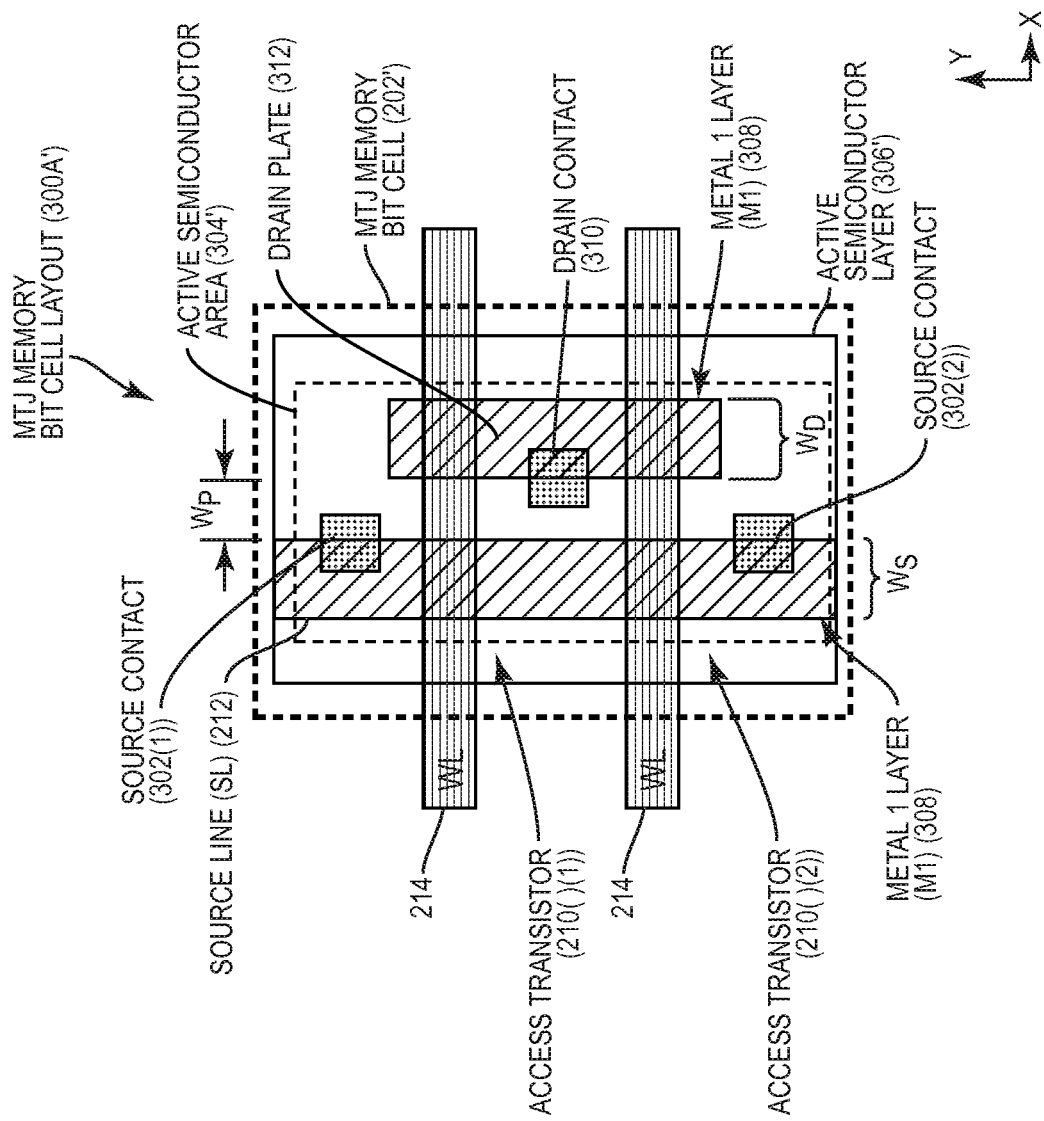
FIG. 4 is a top view of another partial MTJ memory bit cell layout for a 2T-1MTJ memory bit cell having a reduced active semiconductor area causing a contact between a source line and a drain column, and a source contact and a drain contact of an access transistor, respectively, to be skewed thereby increasing contact resistance.
Figures 5A, 5B, 5C:
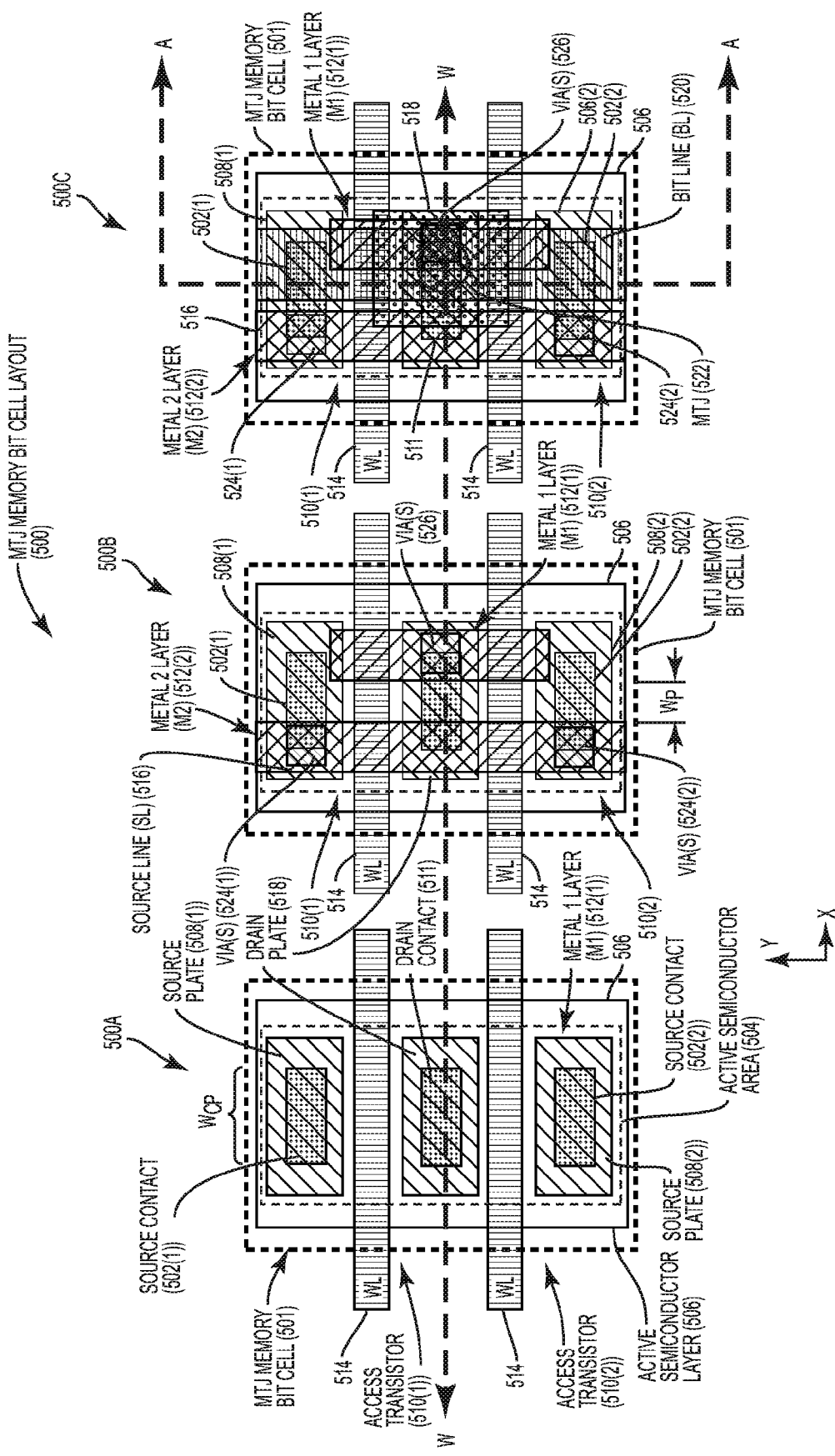
FIGS. 5A-5C are top views of an alternative MTJ memory bit cell layout for a 2T-1MTJ memory bit cell that includes a source plate disposed above and in contact with a source contact for a source node of an access transistor to decouple a source line layout from access transistor contact placement to facilitate reduced contact resistance.

Before discussing the exemplary MTJ memory bit cells that involve decoupling contact of a source contact and a source line of an MTJ to facilitate reduced contact resistance starting at FIG. 5A, an MTJ memory bit cell circuit and conventional layout is first discussed with regard to FIGS. 2-4.

In this regard, FIG. 2 is a circuit diagram of an exemplary MTJ memory bit cell column 200 that can be provided in an MRAM for example. The MTJ memory bit cell column 200 employs two transistor (2T), one (1) MTJ (2T-1MTJ) memory bit cells 202(1)-202(N) ("MTJ memory bit cells 202(1)-202(N)") for memory storage, where 'N' can represent any number of MTJ memory bit cells 202 desired. Each MTJ memory bit cell 202(1)-202(N) employs a respective MTJ 204(1)-204(N) for bit storage. Each MTJ 204(1)-204(N) is electrically coupled to and between a common drain node (D) of respective access transistor pairs 206(1)-206(N) and a bit line (BL) 208. Two access transistors 210( )(1), 210( )(2) are coupled together in parallel in each access transistor pair 206(1)-206(N) to provide more drive strength to each respective MTJ 204(1)-204(N). A source line (SL) 212 is coupled to source nodes (S) of the access transistors 210(1)-210(N). A gate node (G) of a particular access transistor pair 206(1)-206(N) is activated to activate a respective MTJ 204(1)-204(N) by activating a respective word line (WL) 214(1)-214(N). A voltage differential between the bit line (BL) 208 and the source line (SL) 212 is applied across an activated MTJ 204(1)-204(N) for read and write operations.

Each MTJ memory bit cell 202(1)-202(N) in FIG. 2 can be provided in an MTJ memory bit cell layout to fabricate the MTJ memory bit cells 202(1)-202(N) in an integrated circuit (IC). In this regard, FIGS. 3A and 3B illustrate conventional MTJ memory bit cell layout 300 that can be employed in the MTJ memory bit cells 202(1)-202(N) in the MTJ memory bit cell column 200 in FIG. 2. In this regard, FIG. 3A illustrates a top view of a partial MTJ memory bit cell layout 300A for the MTJ memory bit cell 202 that does not illustrate the MTJ 204 and the bit line (BL) 208 fabricated into the MTJ memory bit cell layout 300A. FIG. 3B illustrates a top view of a final MTJ memory bit cell layout 300B for a MTJ memory bit cell 202 that includes the MTJ 204 and the bit line (BL) 208 disposed in higher layers.

As shown in the partial MTJ memory bit cell layout 300A in FIG. 3A, source contacts 302(1), 302(2) are disposed directly above and in contact with respective source nodes (S) of the access transistors 210( )(1), 210( )(2) in an active semiconductor area 304 of an active semiconductor layer 306. The source contacts 302(1), 302(2) are aligned in the X-direction shown. In this manner, the source line (SL) 212 of width Ws can be extended in the Y-direction in a metal 1 layer (M1) 308 above and in contact with the source contacts 302(1), 302(2) to be connected to the source nodes (S) of the access transistors 210( )(1), 210( )(2). Similarly, a drain contact 310 is also disposed directly above and in contact with the shared drain node (D) of the access transistors 210( )(1), 210( )(2) in the active semiconductor area 304 of the active semiconductor layer 306. A drain plate 312 of width WD is provided that extends in the Y-direction in metal 1 layer (M1) 308 above and in contact with the drain contact 310. In this manner, as shown in the final MTJ memory bit cell layout 300B in FIG. 3B, electrical connections can be made to the drain plate 312 through one or more vias 314 to provide an electrical connection of the shared drain node (D) of the access transistors 210( )(1), 210( )(2) to the MTJ 204 in the MTJ memory bit cell 202.

To minimize the contact resistance of the MTJ memory bit cells 202 in the MTJ memory bit cell column 200, the MTJ memory bit cell layout 300 in FIGS. 3A and 3B is arranged such that the source line (SL) 212 and the drain plate 312 are aligned and fully overlap (e.g., centered on) the source contacts 302(1), 302(2) and the drain contact 310, respectively, to provide contact to the full surface area of the source contacts 302(1), 302(2) and drain contact 310. Fabrication processes will dictate a minimum pitch distance between the source line 212 and the drain plate 312 in the metal 1 layer (M1) 308, shown as width WP, in the MTJ memory bit cell layouts 300 in FIGS. 3A and 3B. Thus, it may be desired to locate the source line (SL) 212 and the drain plate 312 in the MTJ memory bit cell layout 300 as close to the edge of the active semiconductor area 304 as possible, but while still fully overlapping the source contacts 302(1), 302(2) and drain contact 310, respectively, to minimize contact resistance. Full overlapping of the source contacts 302(1), 302(2) and drain contact 310 by the source line (SL) 212 and the drain plate 312 may be important for contact resistance, because the source contacts 302(1), 302(2) and drain contact 310 may be made of a material that can be disposed in contact with silicon but has a larger resistance (e.g., tungsten—up to about 100 ohms in 28 nanometer (nm) logic node), as opposed to a metal layer material (e.g., copper via which has about 1 to 10 ohm in the said 28 nm logic node). Further, the contact resistance may vary by a factor of four (4) or five (5) up and down for example due to process variations. Thus, contact resistance is a highly variable contribution to the overall resistance of the MTJ memory bit cell 202.

However, as shown in an alternative MTJ memory bit cell layout 300A' in FIG. 4, as the node size of the access transistors 210( )(1), 210( )(2) in the MTJ memory bit cell 202' is reduced to increase switching speed as fabrication processes allow, the active semiconductor area 304' in the active semiconductor layer 306' shrinks in the X-direction. As the active semiconductor area 304' shrinks in the X-direction, the source contacts 302(1), 302(2) and the drain contact 310 also move closer together in the X-direction. However, it may not be possible to move the source line (SL) 212 and the drain plate 312 closer together in the X-direction in the metal 1 layer (M1) 308 to effectively reduce width WP, due to fabrication limitations. Instead, as shown in FIG. 4, the source line (SL) 212 and the drain plate 312 are skewed in the X-direction from the source contacts 302(1), 302(2) and the drain contact 310, respectively, such that the source line (SL) 212 and the drain plate 312 partially overlay and do not contact the entire surface area of the source contacts 302(1), 302(2) and the drain contact 310. Thus, contact resistance between the source line (SL) 212 and the drain plate 312 and the source contacts 302(1), 302(2) and the drain contact 310, respectively, increases as a result. This can cause a reduction in write current (I) margin, which can lead to reduced write performance of the MTJ memory bit cell 202' and yield loss. The voltage generated across the MTJ 204 can be increased to maintain the write current (I) margin, but increasing voltage increases power consumption, which may be undesirable.

In this regard, to allow for node size of an MTJ memory bit cell to be reduced without having to increase contact resistance, aspects discussed below involve MTJ memory bit cell layouts that allow for decoupling of a source line layout from access transistor contact placement to facilitate reduced contact resistance. In this regard, FIGS. 5A-5C are top views of an alternative MTJ memory bit cell layout 500 for a 2T-1MTJ memory bit cell 501 that provides for decoupling of a source line layout from access transistor contact placement to facilitate reduced contact resistance. FIG. 5A illustrates a partial MTJ memory bit cell layout 500A for the MTJ memory bit cell 501 to illustrate the decoupling of the source line layout from access transistor contact placement to facilitate reduced contact resistance. In this example, the MTJ memory bit cell 501 is a 2T-1MTJ memory bit cell. In this regard, access transistors 510(1), 510(2) are provided in an active semiconductor area 504 of an active semiconductor layer 506 that include source nodes (S) and a shared drain node (D), similar to the access transistors 210( )(1), 210( )(2) in the MTJ memory bit cells 202(1)-202(N) in FIG. 2, for performing reading and writing operations in the MTJ memory bit cell 501. Word lines (WL) 514 are provided in the MTJ memory bit cell 501 similarly to the word lines (WL) 214 in the MTJ memory bit cells 202(1)-202(N) in FIGS. 3A and 3B.

As shown in the MTJ memory bit cell layout 500A in FIG. 5A, source plates 508(1), 508(2) are provided that are disposed above and in contact with source contacts 502(1), 502(2) for the source nodes (S) of the access transistors 510(1), 510(2). In this manner, the source plates 508(1), 508(2) are electrically coupled to the source nodes (S) of the access transistors 510(1), 510(2). For example, the source plates 508(1), 508(2) may be source metal plates that forms a source metal line disposed in a metal 1 layer (M1) 512(1) above the source contacts 502(1), 502(2). Thus, as shown in the MTJ memory bit cell layout 500B in FIG. 5B, the source plates 508(1), 508(2) allow a source line (SL) 516 to be provided in a higher metal level from the source contacts 502(1), 502(2) of the access transistors 510(1), 510(2) such that the source line (SL) 516 is not in direct physical contact with the source contacts 502(1), 502(2). The source line (SL) 516 is provided in a metal 2 layer (M2) 512(2) in this example, as shown in the MTJ memory bit cell layout 500B in FIG. 5B. The source line (SL) 516 is in contact with the source plates 508(1), 508(2), which are disposed in the metal 1 layer (M1) 512(1) over and in contact with the source contacts 502(1), 502(2). In this manner, the source line (SL) 516 is physically decoupled from layout of the source contacts 502(1), 502(2). So for example, if the layout of the source contacts 502(1), 502(2) moves in the X-direction due to the reduction in the active semiconductor area 504, which causes the source nodes (S) and the shared drain node (D) of the access transistors 510(1), 510(2) to move closer together in the X-direction, the source line (SL) 516 does not have to be moved in the MTJ memory bit cell layout 500B in FIG. 5B. Thus, the pitch WP1 between a drain plate 518 disposed above and in contact with a drain contact 511, and the source line (SL) 516 can be decoupled or relaxed from the active semiconductor area 504 of the MTJ memory bit cell 501.

Figure 6:
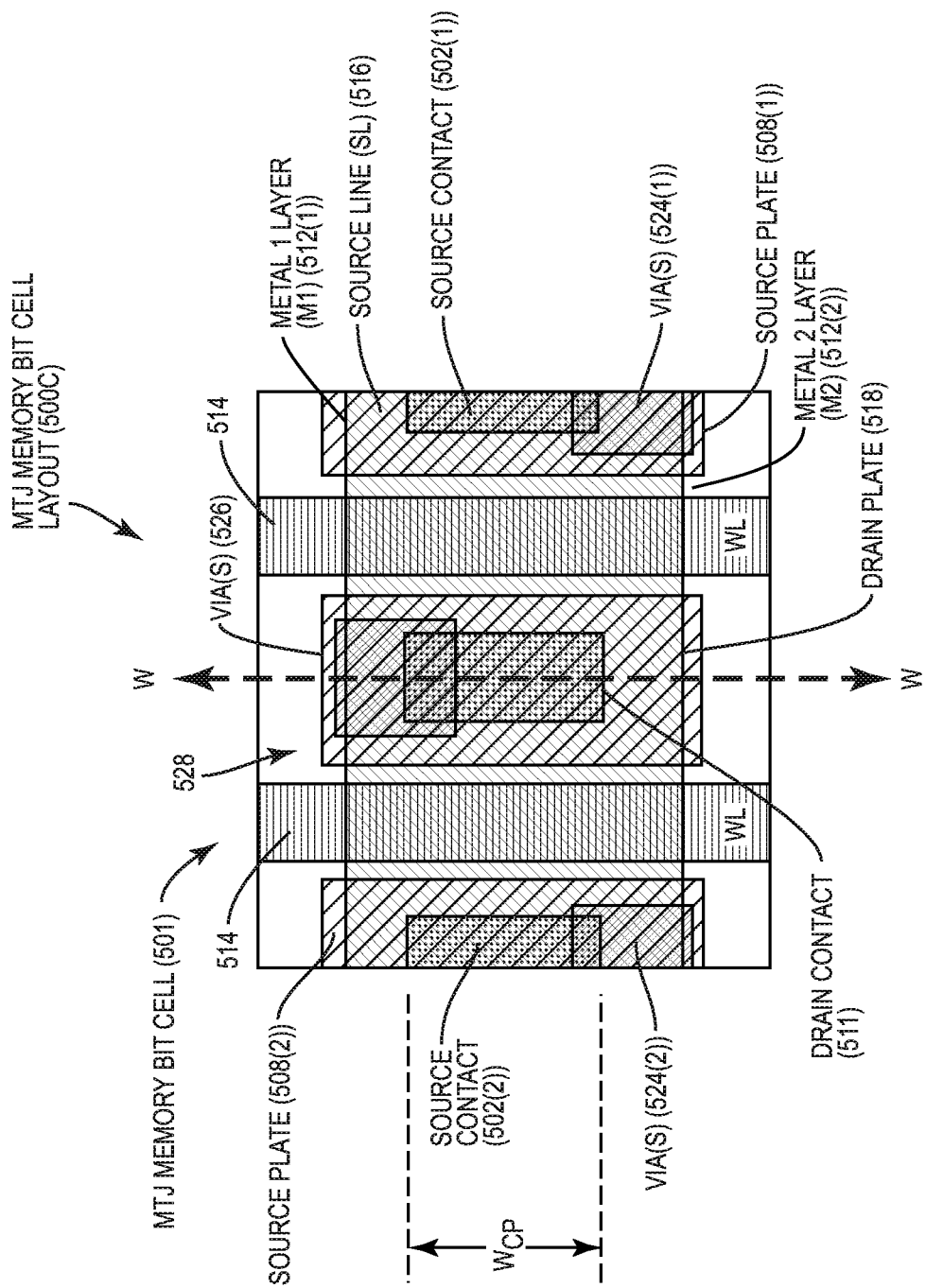
FIG. 6 is close-up, top view of the exemplary MTJ memory bit cell layout for the 2T-1MTJ memory bit cell in FIGS. 5A-5C.

As shown in a final MTJ memory bit cell layout 500C in FIG. 5C, a bit line (BL) 520 is disposed above an MTJ 522 in a higher metal layer through one or more vias 526 to form the MTJ memory bit cell 501. FIG. 6 illustrates a close-up, top view of the exemplary MTJ memory bit cell layout 500C for the MTJ memory bit cell 501 in FIG. 5C showing the source contacts 502(1), 502(2) and the source line (SL) 516 provided in the metal 2 layer (M2) 512(2) above the metal 1 layer (M1) 512(1) where the drain plate 518 is disposed.

Further, in this example of the MTJ memory bit cell layout 500 in FIGS. 5A-5C, as another option to further reduce contact resistance of the MTJ memory bit cell 501, the source contacts 502(1), 502(2) and drain contact 511 are provided as elongated contacts to increase their size. The source contacts 502(1), 502(2) and drain contact 511 are elongated in the width axis W of the active semiconductor layer 506, which is in the X-direction. For example, the source contacts 502(1), 502(2) and drain contact 511 are rectangular-shaped in this example, as a non-limiting example. Providing elongated source contacts 502(1), 502(2) and drain contact 511 provides greater flexibility in contacting the full surface area of the source nodes (S) and drain node (D) of the access transistors 510(1), 510(2) as node size is reduced and the source nodes (S) and drain node (D) move closer together in the X-direction. Further, providing elongated source contacts 502(1), 502(2) and drain contact 511 can also allow a greater surface area for the source plates 508(1), 508(2) and drain plate 518 to contact the source contacts 502(1), 502(2) and drain contact 511 to further reduce contact resistance. Also in this example, the source plates 508(1), 508(2) and drain plate 518 are elongated in the same direction, the X-direction, as the source contacts 502(1), 502(2) and drain contact 511 so that the source plates 508(1), 508(2) and drain plate 518 can fully overlay and contact the surface area of the source contacts 502(1), 502(2) and drain contact 511. However, such is not required. For example, the source contacts 502(1), 502(2) and drain contact 511 could be arranged like provided in the MTJ memory bit cell layout 300 in FIGS. 3A and 3B.

Figure 7:
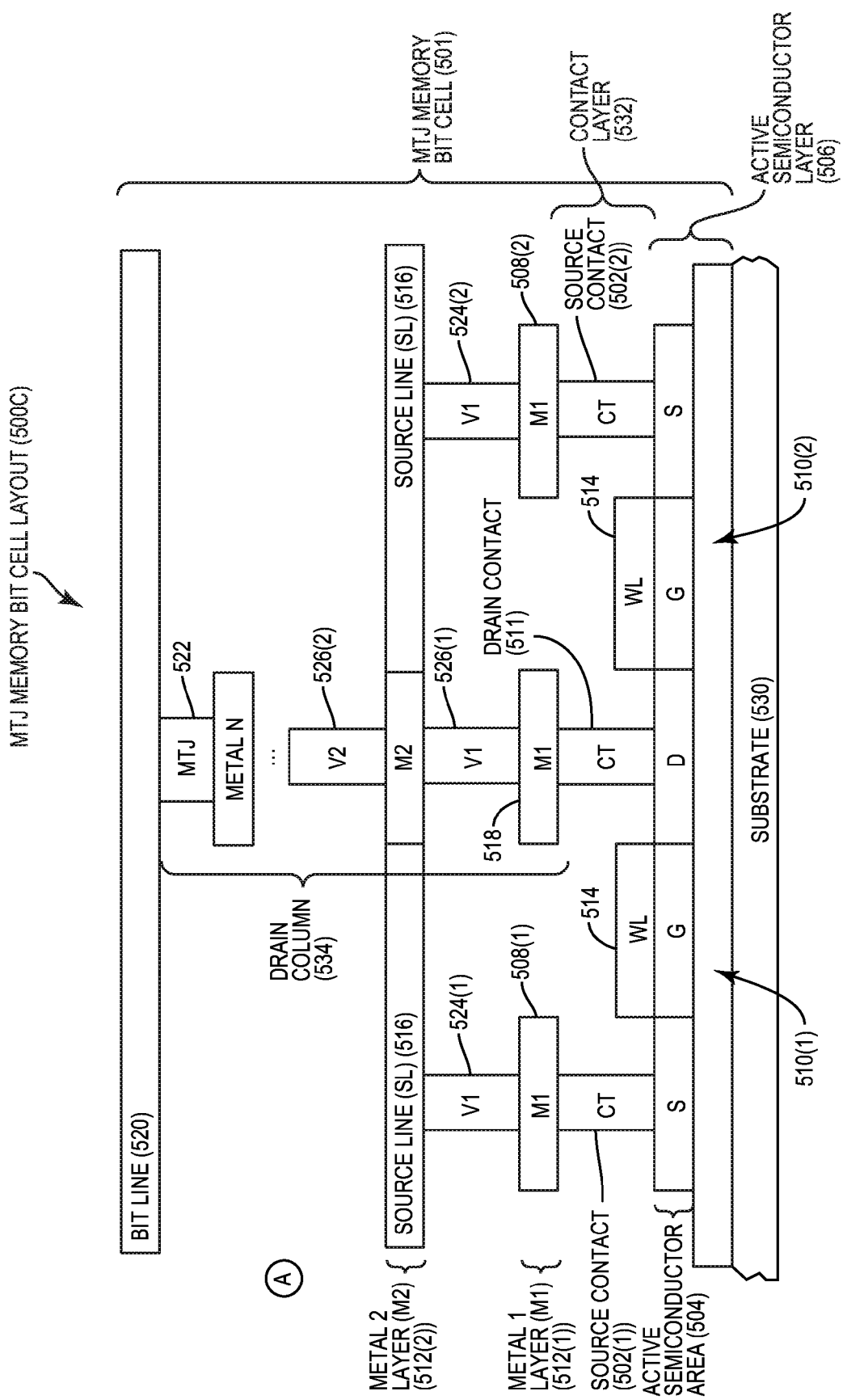
FIG. 7 is a side view of the final MTJ memory bit cell layout for the 2T-1MTJ memory bit cell in FIG. 5C.

To further illustrate the MTJ memory bit cell 501 in FIGS. 5A-5C and its MTJ memory bit cell layout 500, FIG. 7 is provided. FIG. 7 is a side view of the final MTJ memory bit cell layout 500C for the MTJ memory bit cell 501 in FIG. 5C across the A-A line in FIG. 5C. As shown therein, the active semiconductor layer 506 is disposed on a substrate 530. The access transistors 510(1), 510(2) are provided in the active semiconductor area 504 and comprise the source nodes (S), the gate nodes (G), and the shared drain node (D). A contact layer 532 is provided in the MTJ memory bit cell 501 that comprises the source contacts 502(1), 502(2), the word lines (WL) 514 and the drain contact 511. Instead of the source line (SL) 516 being disposed in the metal 1 layer (M1) 512(1) and in direct contact with the source contacts 502(1), 502(2), the source plates 508(1), 508(2) are provided in the metal 1 layer (M1) 512(1) in this example. As previously discussed above, the source line (SL) 516 is disposed in a higher metal layer, which is the metal 2 layer (M2) 512(2) in this example and not in the metal 1 layer (M1) 512(1), to be decoupled from the layout of the source contacts 502(1), 502(2). In this example, the source line (SL) 516 is electrically connected to the source plates 508(1), 508(2) to be electrically connected to the source contacts 502(1), 502(2) by vias 524(1), 524(2). In this manner, as discussed above, if the layout of the source contacts 502(1), 502(2) is changed, such as to reduce contact resistance and contact resistance variation, the source line (SL) 516 does not necessarily have to be located in the MTJ memory bit cell layout 500C closer to a drain column 534, such as if there are minimum pitch limitations in the metal layers.

Figure 8:
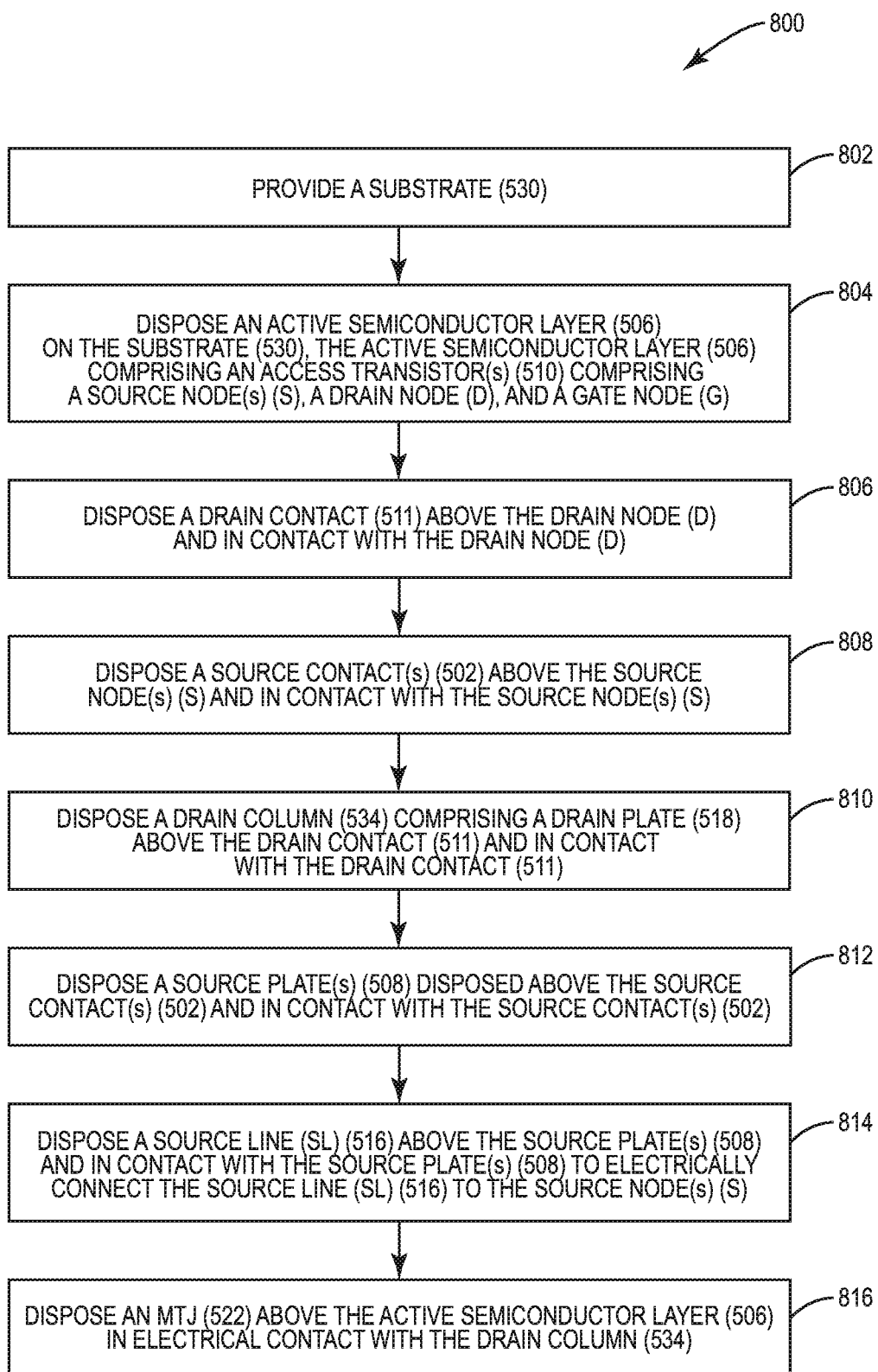
FIG. 8 is a flowchart illustrating an exemplary process for fabricating an MTJ memory bit cell that includes a source plate disposed above and in contact with a source contact for a source node of an access transistor to decouple a source line layout from access transistor contact placement to facilitate reduced contact resistance.

FIG. 8 is a flowchart illustrating an exemplary process 800 for fabricating an MTJ memory bit cell that includes a source plate disposed above and in contact with a source contact for a source node of an access transistor to decouple a source line layout from access transistor contact placement to facilitate reduced contact resistance. For example, the exemplary process 800 will be discussed in regard to fabricating the final MTJ memory bit cell layout 500C in FIG. 5C to provide the MTJ memory bit cell 501. However, note that the process 800 in FIG. 8 can be employed to fabricate other types of MTJ memory bit cells including a source plate disposed above and in contact with a source contact for a source node of an access transistor to decouple a source line layout from access transistor contact placement to facilitate reduced contact resistance.

In this regard, the process 800 to fabricate the MTJ memory bit cell 501 in FIGS. 5A-5C and 7 starts by providing the substrate 530 (block 802). The active semiconductor layer 506 is disposed on the substrate 530, where the active semiconductor layer 506 comprises the access transistor(s) 510 that includes a source node(s) (S), a drain node (D), and a gate node (G) (block 804). The drain contact 511 is disposed above the drain node (D) and is in contact with the drain node (D) to facilitate electrical connection to the drain node (D) (block 806). The source contact(s) 502 is disposed above the source node(s) (S) and is in contact with the source node(s) (S) to facilitate electrical connection to the source node(s) (S) (block 808). A drain column 534 comprises the drain plate 518 is disposed above the drain contact 511 and in contact with the drain contact 511 to facilitate electrical connection to the MTJ 522 (block 810). The source plate(s) 508 are disposed above the source contact(s) 502 and in contact with the source contact(s) 502 to facilitate electrical connection to the source line (SL) 516 without a direct connection between the source line (SL) 516 and the source contact(s) 502 (block 812). The source line (SL) 516 is disposed above the source plate(s) 508 and in electrical contact with the source plate(s) 508 to electrically connect the source line (SL) 516 to the source node(s) (S) of the access transistor(s) 510 (block 814). The MTJ 522 is disposed above the active semiconductor layer 506 in electrical contact with the drain column 534 to electrically connect the MTJ 522 to the drain node (D) of the access transistor(s) 510 (block 816).

Figure 9:
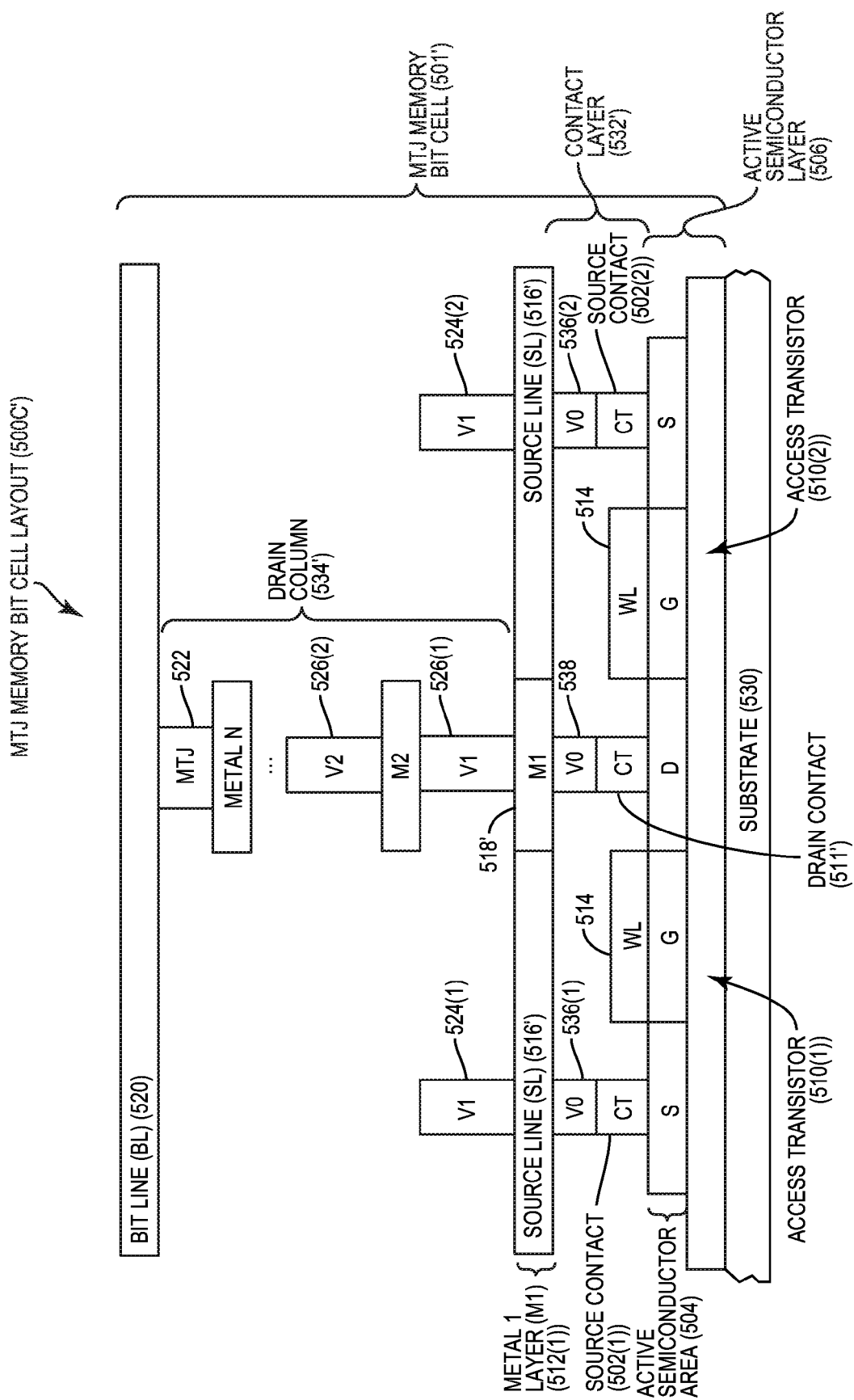
FIG. 9 is a side view of an alternative final MTJ memory bit cell layout for a 2T-1MTJ memory bit cell that includes a source plate provided as a via disposed above and in contact with a source contact for a source node of an access transistor to decouple a source line layout from access transistor node size to facilitate reduced contact resistance.

It is also possible to provide for a source line (SL) in the first metal interconnect layer directly above a contact layer of an MTJ memory bit cell while also decoupling the source line (SL) layout from source contacts. In this regard, FIG. 9 is a side view of an alternative final MTJ memory bit cell layout 500C' for an MTJ memory bit cell 501' that is similar to the MTJ memory bit cell 501 in FIG. 7. Common elements between the MTJ memory bit cell 501' in FIG. 9 and the MTJ memory bit cell 501 in FIG. 7 are shown in FIG. 9 with common element numbers with FIG. 7, and thus will not be re-described. However, as shown in FIG. 9, a contact layer 532' is provided that includes source contacts 502(1)', 502(2)' and vias (V0) 536(1), 536(2) dispose above and in contact with the source contacts 502(1)', 502(2)'. A source line (SL) 516' is disposed above and in contact with the vias (V0) 536(1), 536(2) to provide an electrical connection to the source contacts 502(1)', 502(2)'. In this manner, the source line (SL) 516' is decoupled from the layout of the source contacts 502(1)', 502(2)' by not being directly connected to the source contacts 502(1)', 502(2)'. Similarly, a drain plate 518' is disposed above and in contact with a via (V0) 538 to provide an electrical connection to the drain contact 511'. Thus, similar to the final MTJ memory bit cell layout 500C in FIG. 7, if the layout of the source contacts 502(1)' 502(2)' is changed, such as to reduce contact resistance or contact resistance variation, the source line (SL) 516' does not necessarily have to be located in the MTJ memory bit cell layout 500C' closer to the drain column 534', such as if there are minimum pitch limitations in the metal layers.

Figures 10A, 10B, 10C:
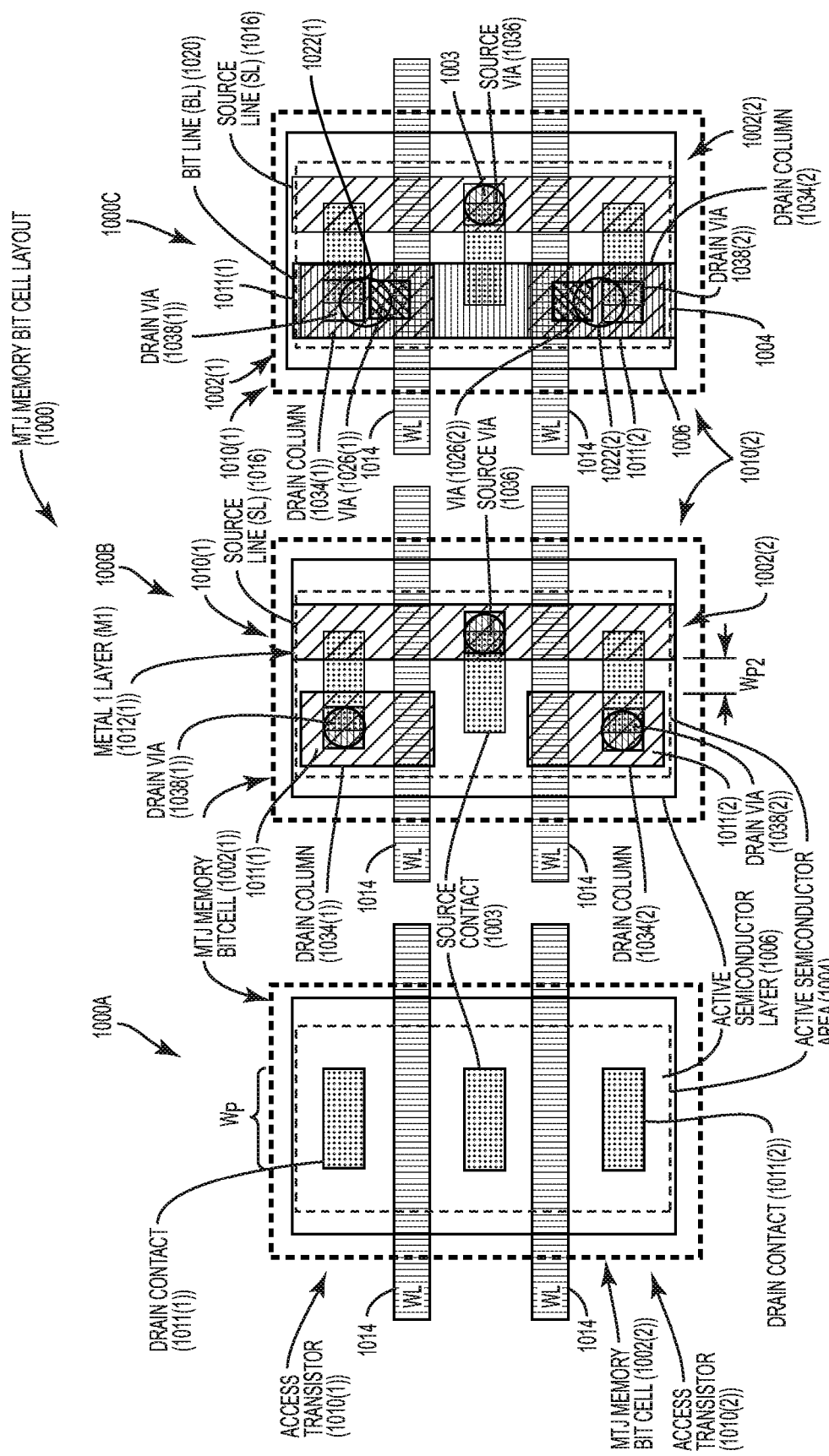
FIGS. 10A-10C are top views of an MTJ memory bit cell layout for a 1T-1MTJ memory bit cell that includes a source plate disposed above and in contact with a source contact for a source node of an access transistor to decouple a source line layout from access transistor contact placement to facilitate reduced contact resistance.

It is also possible to provide other types of MTJ memory bit cells that employ one or more elongated active contact pads, such as an active source pad. For example, a one transistor, one (1) MTJ (1T-1MTJ) memory bit cell can be provided that includes decoupling of a source line from a source contact of an access transistor to facilitate a reduced contact resistance. In this regard, FIGS. 10A-10C are top views of an alternative MTJ memory bit cell layout 1000 for 1T-1MTJ, MTJ memory bit cells 1002(1), 1002(2) ("MTJ memory bit cells 1002(1), 1002(2)"). As discussed in more detail below, the MTJ memory bit cell layout 1000 in FIGS. 10A-10C provides for a source line (SL) in a metal interconnect layer directly above a contact layer of the MTJ memory bit cells 1002(1), 1002(2) while also decoupling the source line (SL) layout from source and drain contacts, similar to the MTJ memory bit cell layout 500C' in FIG. 9.

In this regard, FIG. 10A illustrates a partial MTJ memory bit cell layout 1000A for two (2) MTJ memory bit cells 1002(1), 1002(2) to illustrate the decoupling of the source line layout from access transistor contact placement in a 1T-1MTJ memory bit cell to facilitate reduced contact resistance. In this regard, access transistors 1010(1), 1010(2) are provided in an active semiconductor area 1004 of an active semiconductor layer 1006 that includes a source node (S) and drain nodes (D) for performing reading and writing operations in the MTJ memory bit cells 1002(1), 1002(2). Drain contacts 1011(1), 1011(2) and a source contact 1003 of the respective access transistors 1010(1), 1010(2) are shown disposed in the X-direction of width Wp similar to the MTJ memory bit cell layout 500 in FIGS. 5A-5C. Word lines (WL) 1014 are provided in the MTJ memory bit cells 1002(1), 1002(2) similarly to the word lines (WL) 214 in the MTJ memory bit cells 202(1)-202(N) in FIGS. 3A and 3B.

As shown in the MTJ memory bit cell layout 1000B in FIG. 10B, a source via 1036 is disposed above the source contact 1003 to make electrical contact between the source contact 1003 and a source line 1016, as shown in the MTJ memory bit cell layout 1000C in FIG. 10C. The source line 1016 is provided in a metal 1 layer (M1) 1012(1) in this example above the source contact 1003 and the source via 1036. Drain vias 1038(1) and 1038(2) are also disposed in a metal interconnect layer of the respective drain contacts 1011(1), 1011(2) to make electrical contact to respective drain columns 1034(1), 1034(2), as shown in FIG. 10B. The source via 1036 and the drain vias 1038(1), 1038(2) are offset in the X-direction in this example to allow for layout of the source line (SL) 1016 to have adequate spacing from the drain columns 1034(1), 1034(2).

As shown in a final MTJ memory bit cell layout 1000C in FIG. 10C, a bit line (BL) 1020 is disposed above MTJs 1022(1), 1022(2) in a higher metal layer through one or more vias 1026(1), 1026(2) provided in the drain columns 1034(1), 1034(2) to form the MTJ memory bit cells 1002(1), 1002(2). The source line (SL) 1016 is disposed above and is electrically connected to the source via 1036, which is disposed above and is electrically connected to the source contact 1003.

It is to be understood that the examples disclosed herein are not limited to a two transistor (2T), one (1) MTJ (2T-1MTJ) or one transistor (1T), one (1) MTJ (1T-1MTJ) bit cell. These aspects disclosed herein can be applied to any MRAM bit cell or array architecture. It may be desired to employ the aspects disclosed herein for MRAM bit cell architectures in which source line or bit line resistance negatively impacts write margin, power consumption, or any other aspect of a device employing MRAM bit cells.

MTJ memory bit cells involving decoupling of source line layout from access transistor node size in an MTJ memory bit cell to facilitate reduced contact resistance, including those MTJ memory bit cells according to aspects disclosed herein, may be provided in or integrated into in any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 11:
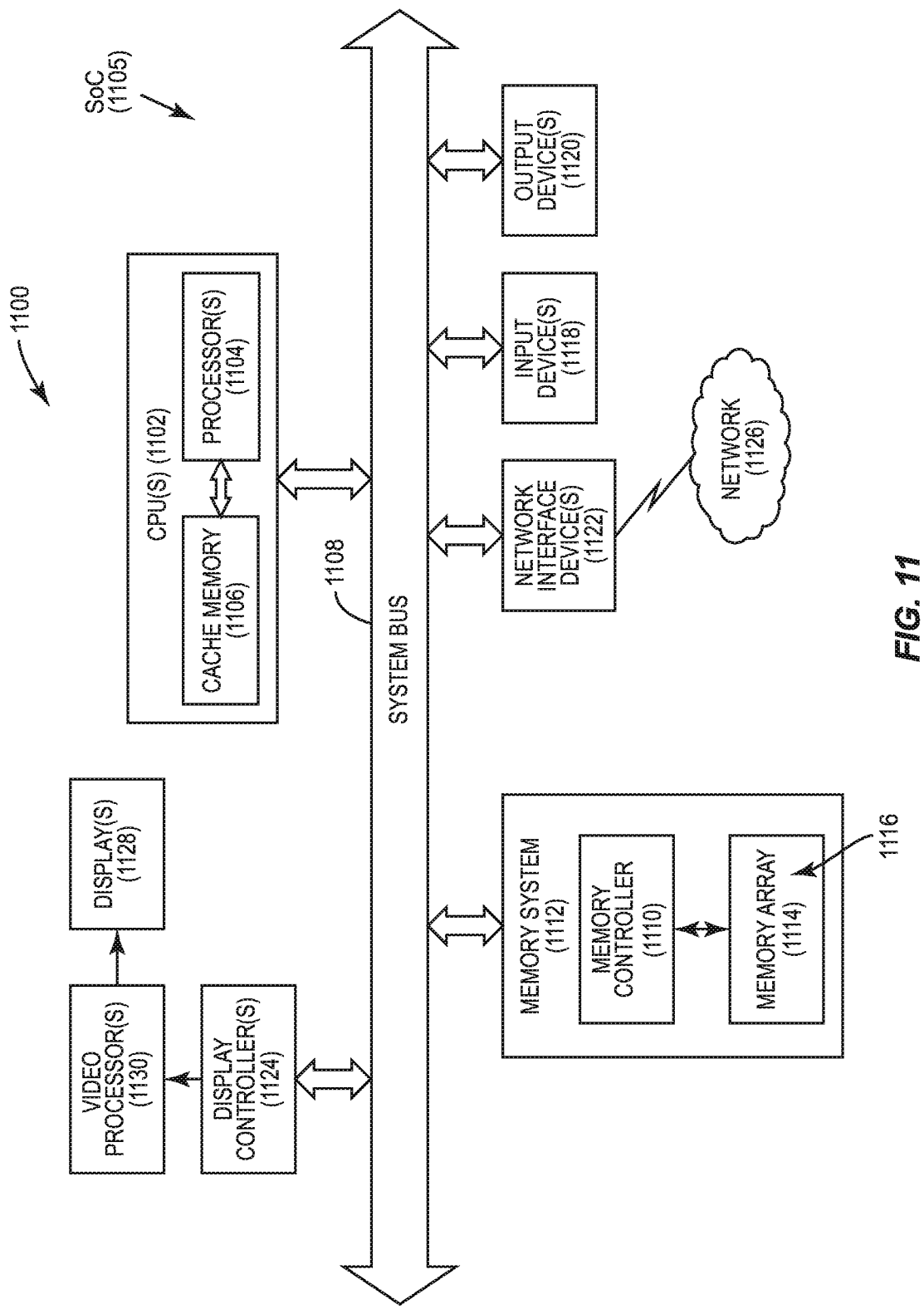
FIG. 11 is a block diagram of an exemplary processor-based system that can include a memory system employing MRAM bit cells employing MTJ memory bit cells according to any of the aspects disclosed herein.

In this regard, FIG. 11 illustrates an example of a processor-based system 1100 that can include MRAM memory employing MTJ memory bit cells that decouple a source line layout from access transistor node size in an MTJ according to any of the particular aspects discussed above. In this example, the processor-based system 1100 includes one or more CPUs 1102, each including one or more processors 1104. The processor-based system 1100 may be provided as a system-on-a-chip (SoC) 1105. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 in a memory system 1112 as an example of a slave device. Although not illustrated in FIG. 11, multiple system buses 1108 could be provided, wherein each system bus 1108 constitutes a different fabric. In this example, the memory controller 1110 is configured to provide memory access requests to a memory array 1114 in the memory system 1112. The memory array 1114 can include MRAM bit cells 1116 that employ MTJ memory bit cells that decouple a source line layout from access transistor node size in an MTJ, including according to any of the particular aspects discussed above. The cache memory 1106 could also include MRAM bit cells that include MTJ memory bit cells that decouple a source line layout from access transistor node size in an MTJ, including according to any of the particular aspects discussed above.

Other devices can be connected to the system bus 1108. As illustrated in FIG. 11, these devices can include the memory system 1112, one or more input devices 1118, one or more output devices 1120, one or more network interface devices 1122, and one or more display controllers 1124, as examples. The input device(s) 1118 can include any type of input device, including but not limited to input keys, switches, voice processors, etc. The output device(s) 1120 can include any type of output device, including but not limited to audio, video, other visual indicators, etc. The network interface device(s) 1122 can be any devices configured to allow exchange of data to and from a network 1126. The network 1126 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1122 can be configured to support any type of communications protocol desired.

The CPU(s) 1102 may also be configured to access the display controller(s) 1124 over the system bus 1108 to control information sent to one or more displays 1128. The display controller(s) 1124 sends information to the display(s) 1128 to be displayed via one or more video processors 1130, which process the information to be displayed into a format suitable for the display(s) 1128. The display(s) 1128 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magnetic tunnel junction (MTJ) memory bit cell in an integrated circuit (IC), comprising:
   an active semiconductor layer comprising an access transistor comprising a source node, a drain node, and a gate node;
   a drain contact disposed above the drain node and in contact with the drain node;
   a source contact disposed above the source node and in contact with the source node;
   a drain column comprising a drain plate disposed above the drain contact and in contact with the drain contact;
   an MTJ disposed above the active semiconductor layer in electrical contact with the drain column;
   a source plate comprising a metal line disposed in a first metal layer above the source contact and in contact with the source contact; and
   a source line disposed in a second metal layer above the first metal layer, the source line in electrical contact with the source plate to electrically connect the source line to the source node.

2. The MTJ memory bit cell of claim 1, wherein the source line is not in physical contact with the source contact.

3. The MTJ memory bit cell of claim 1, further comprising a contact layer comprising the source contact, the drain contact, the source plate, and the drain plate, wherein the source line is not disposed in the contact layer.

4. The MTJ memory bit cell of claim 1, wherein the source plate and the drain plate are aligned along a width axis of the active semiconductor layer.

5. The MTJ memory bit cell of claim 1, wherein the source plate comprises a source metal plate.

6. The MTJ memory bit cell of claim 1, wherein the first metal layer is comprised of a metal one (M1) layer.

7. The MTJ memory bit cell of claim 1, wherein the source contact is comprised of an elongated source contact.

8. The MTJ memory bit cell of claim 7, wherein the elongated source contact is rectangular shaped.

9. The MTJ memory bit cell of claim 1, wherein the drain contact is comprised of an elongated drain contact.

10. The MTJ memory bit cell of claim 9, wherein the elongated drain contact is rectangular shaped.

11. The MTJ memory bit cell of claim 1, comprising a one transistor, one MTJ (1T-1MTJ) memory bit cell.

12. The MTJ memory bit cell of claim 1, wherein the active semiconductor layer further comprises a second access transistor comprising a second source node, the drain node, and a second gate node; and further comprising:
- a second source contact disposed above the second source node and in contact with the second source node; and
- a second source plate comprising a second metal line disposed in the first metal layer above the second source contact and in contact with the second source contact;
- the source line in electrical contact with the source plate and the second source plate to electrically connect the source line to the source node and the second source node.

13. The MTJ memory bit cell of claim 1 disposed in a magnetic random access memory (MRAM) array disposed in a processor-based system.

14. The MTJ memory bit cell of claim 13, wherein the processor-based system is disposed in a central processing unit (CPU)-based system-on-a-chip (SoC).

15. The MTJ memory bit cell of claim 1 integrated into an IC.

16. The MTJ memory bit cell of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

17. A magnetic tunnel junction (MTJ) memory bit cell in an integrated circuit (IC), comprising:
- a means for providing an access transistor in an active semiconductor layer, the means for providing the access transistor comprising a source node, a drain node, and a gate node;
- a means for contacting the drain node, disposed above the drain node;
- a means for contacting the source node, disposed above the source node;
- a means for contacting the means for contacting the drain node, disposed above the means for contacting the drain node;
- an MTJ disposed above the active semiconductor layer in electrical contact with a drain column;
- a means for providing a metal line for contacting the means for contacting the source node, disposed in a first metal layer above the means for contacting the source node; and
- a means, in a second metal layer above the first metal layer, for providing a source line in electrical contact with the means for providing the metal line for contacting the means for contacting the source node, to electrically connect the means for providing the source line to the means for contacting the source node.

18. A method of fabricating a magnetic tunnel junction (MTJ) memory bit cell in an integrated circuit (IC), comprising:

providing a substrate;
disposing an active semiconductor layer on the substrate, the active semiconductor layer comprising an access transistor comprising a source node, a drain node, and a gate node;
disposing a drain contact above the drain node and in contact with the drain node;
disposing a source contact above the source node and in contact with the source node;
disposing a drain column comprising a drain plate above the drain contact and in contact with the drain contact;
disposing a source plate comprising a metal line in a first metal layer above the source contact and in contact with the source contact;
disposing a source line in a second metal layer above the first metal layer in electrical contact with the source plate to electrically connect the source line to the source node; and
disposing an MTJ above the active semiconductor layer in electrical contact with the drain column.

19. The method of claim 18, further comprising not disposing the source line in physical contact with the source contact.

20. The method of claim 18, further comprising disposing a contact layer above the active semiconductor layer, the contact layer comprising the source contact, the drain contact, the source plate, and the drain plate, wherein the source line is not disposed in the contact layer.

21. The method of claim 18, wherein:
disposing the source plate further comprises disposing the source plate along a width axis of the access transistor; and
disposing the drain plate further comprises disposing the drain plate along the width axis of the access transistor in alignment with the source plate.

22. The method of claim 18, wherein:
disposing the active semiconductor layer further comprises disposing a second access transistor above the substrate, the second access transistor comprising a second source node, the drain node, and a second gate node;
further comprising:
- disposing a second source contact above the second source node and in contact with the second source node; and
- disposing a second source plate comprising a second metal line in the first metal layer in contact with the second source contact;
wherein disposing the source line comprises disposing the source line in the second metal layer in electrical contact with the source plate and the second source plate, to electrically connect the source line to the source node and the second source node.

23. A magnetic tunnel junction (MTJ) memory bit cell in an integrated circuit (IC), comprising:
an active semiconductor layer comprising an access transistor comprising a source node, a drain node, and a gate node;
a drain contact disposed in a contact layer above the drain node and in contact with the drain node;
a source contact disposed in a contact layer above the source node and in contact with the source node;
a via disposed above the source contact and in contact with the source contact;
a drain column comprising a drain plate disposed above the drain contact and in contact with the drain contact;
an MTJ disposed above the active semiconductor layer in electrical contact with the drain column; and a source line disposed in a first metal layer above the contact layer, the source line in contact with the via to electrically connect the source line to the source node.

24. The MTJ memory bit cell of claim 23, wherein the source line is not in physical contact with the source contact.

25. The MTJ memory bit cell of claim 23, wherein the drain plate is disposed in the first metal layer.

26. The MTJ memory bit cell of claim 23, wherein the first metal layer is comprised of a metal one (M1) layer.

27. The MTJ memory bit cell of claim 23, wherein the source contact is comprised of an elongated source contact.

28. The MTJ memory bit cell of claim 27, wherein the elongated source contact is rectangular shaped.

29. The MTJ memory bit cell of claim 23, wherein the drain contact is comprised of an elongated drain contact.

30. The MTJ memory bit cell of claim 29, wherein the elongated drain contact is rectangular shaped.

31. The MTJ memory bit cell of claim 23, comprising a one transistor, one MTJ (1T-1MTJ) memory bit cell.

32. The MTJ memory bit cell of claim 23, wherein the active semiconductor layer further comprises a second access transistor comprising a second source node, the drain node, and a second gate node; and further comprising:
a second source contact disposed above the second source node and in contact with the second source node; and
a second via disposed above the second source contact and in contact with the second source contact;
wherein the source line is in contact with the second via and the source plate to electrically connect the source line to the source node and the second source node.

33. The MTJ memory bit cell of claim 23, disposed in a magnetic random access memory (MRAM) array disposed in a processor-based system.

34. The MTJ memory bit cell of claim 33, wherein the processor-based system is disposed in a central processing unit (CPU)-based system-on-a-chip (SoC).

35. The MTJ memory bit cell of claim 23 integrated into an IC.

36. The MTJ memory bit cell of claim 23 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *